(12) United States Patent
Iriguchi

(10) Patent No.: US 7,750,380 B2
(45) Date of Patent: Jul. 6, 2010

(54) SEMICONDUCTOR DEVICE

(75) Inventor: Chiharu Iriguchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/694,366

(22) Filed: Mar. 30, 2007

(65) Prior Publication Data

US 2007/0228426 A1    Oct. 4, 2007

(30) Foreign Application Priority Data

Apr. 3, 2006  (JP)  ............................. 2006-101658
Feb. 23, 2007  (JP)  ............................. 2007-043392

(51) Int. Cl.
*H01L 29/94* (2006.01)
(52) U.S. Cl. ............................. 257/288; 257/E29.275
(58) Field of Classification Search .......... 257/E51.005, 257/E51.006, E29.275, E29.278, E27.117, 257/288
See application file for complete search history.

(56) References Cited

U.S. PATENT DOCUMENTS 6,563,135 B2 * 5/2003 Park ............................. 257/72

6,580,129 B2 * 6/2003 Lui et al. ..................... 257/347
2006/0033098 A1 * 2/2006 Shih et al. ..................... 257/40

FOREIGN PATENT DOCUMENTS

JP    A 2000-216397    8/2000

* cited by examiner

*Primary Examiner*—Lynne A Gurley
*Assistant Examiner*—Colleen A Matthews
(74) *Attorney, Agent, or Firm*—Oliff & Berridge, PLC

(57) ABSTRACT

A semiconductor device includes a substrate, a first gate electrode, a second gate electrode, a first channel region positioned between the substrate and the first gate electrode, a second channel region positioned between the substrate and the second gate electrode, a gate insulation film positioned at least between the first channel region and the first gate electrode, and between the second channel region and the second gate electrode, a first conducting section, a second conducting section, and a third conducting section each positioned between the substrate and the gate insulation film, and an intermediate electrode electrically connected to the second gate electrode, and overlapping a part of the first gate electrode, wherein the first channel region is positioned between the first conducting section and the second conducting section, and the second channel region is positioned between the second conducting section and the third conducting section.

14 Claims, 3 Drawing Sheets

SEMICONDUCTOR DEVICE

BACKGROUND OF THE INVENTION

1. Technical Field

Several aspects of the present invention relate to a semiconductor device, and in particular to a structure technology for improving the electrical characteristic of a thin film transistor.

2. Related Art

The semiconductor device described above is provided with, for example, a thin film transistor (TFT) formed on a glass substrate. In detail, a semiconductor layer is formed on the glass substrate, and a source region and a drain region are provided to the semiconductor layer. Further, the semiconductor layer is provided with a gate electrode formed thereon via a gate insulation film. It is known that in such a semiconductor device, in order for improving reliability of the electrical characteristic, there is provided a lightly doped drain (LDD) structure having a low concentration impurity layer in the source region and the drain region of the semiconductor device or a multi-gate structure composed by connecting a number of gate electrodes. This structure is described in JP-A-2000-216397, for example.

However, in the semiconductor device having the LDD structure, since the load (resistance) becomes large because of the low concentration impurity layer, the output current is reduced because of the voltage drop when a voltage is applied to the thin film transistor. On the other hand, in the semiconductor device having the multi-gate structure, the electric field tends to be concentrated (increased in intensity) at the end portion of the drain region, and the increased electric field intensity might cause an abnormal leakage current in the drain region or dielectric breakdown.

SUMMARY

An advantage of the present invention is to provide a semiconductor device capable of suppressing the reduction of the output current and preventing the leakage current from flowing.

In view of the above technical problems, a semiconductor device according to an aspect of the invention includes a substrate, a first gate electrode, a second gate electrode, a first channel region positioned between the substrate and the first gate electrode, a second channel region positioned between the substrate and the second gate electrode, a gate insulation film positioned at least between the first channel region and the first gate electrode, and between the second channel region and the second gate electrode, a first conducting section, a second conducting section, and a third conducting section each positioned between the substrate and the gate insulation film, and an intermediate electrode electrically connected to the second gate electrode, and overlapping a part of the first gate electrode, wherein the first channel region is positioned between the first conducting section and the second conducting section, and the second channel region is positioned between the second conducting section and the third conducting section.

According to this aspect, it becomes possible to suppress concentration of the electric field on the end portion of the drain region of the transistor included in the semiconductor device, thus the drain withstand voltage can be improved. Therefore, an abnormal leakage current can be prevented from flowing through the drain region of the transistor, and dielectric breakdown can be prevented from being caused in the drain region of the transistor.

In the above semiconductor device, the shortest distance between the first conducting section and the second conducting section is preferably greater than the shortest distance between the second conducting section and the third conducting section.

According to the present configuration, the voltage applied to the second gate electrode can be smaller with respect to the voltage applied to the first gate electrode when the gate voltage is applied to the first gate electrode.

In the above semiconductor device, the intermediate electrode is preferably a metal film with an island shape.

According to the present configuration, the voltage applied to the second gate electrode can be smaller with respect to the voltage applied to the first gate electrode when the gate voltage is applied to the first gate electrode.

In the above semiconductor device, it is preferable that there is further provided an interlayer insulation film positioned at least between the first gate electrode and the intermediate electrode, and between the second gate electrode and the intermediate electrode, and the second gate electrode and the intermediate electrode are electrically connected to each other via a contact plug provided to the interlayer insulation film, and the first gate electrode and the intermediate electrode form a capacitor with the intervention of the interlayer insulation film.

According to the present configuration, a first part of the first gate electrode overlaps with the first channel region via the gate insulating film to form a first capacitor. A second part of the first gate electrode overlaps with a part of the intermediate electrode via an interlayer insulation film to form a second capacitor. The voltage provided for the first electrode is divided into two parts, one for the first capacitor and the other for the second capacitor.

In the above semiconductor device, it is preferable that the second gate electrode and the intermediate electrode are electrically connected to each other via a contact plug provided to the gate insulation film, and the first gate electrode and the intermediate electrode form a capacitor with the intervention of the gate insulation film.

According to the present configuration, a first part of the first gate electrode overlaps with the first channel region via the gate insulating film to form a first capacitor. A second part of the first gate electrode overlaps with a part of the intermediate electrode via an interlayer insulation film to form a second capacitor. The voltage provided for the first electrode is divided into two parts, one for the first capacitor and the other for the second capacitor.

In the above semiconductor device, it is preferable that the first channel region and the second channel region include an inorganic semiconductor material, and each of the first conducting section, the second conducting section, and the third conducting section includes an impurity and the inorganic semiconductor material.

According to the present configurations, when forming the first through third conducting sections, a method of doping the impurity in the semiconductor layer including the inorganic semiconductor material can be used, thus the manufacturing process becomes easy.

In the above semiconductor device, it is preferable that the first channel region and the second channel region include an organic semiconductor material, and each of the first conducting section, the second conducting section, and the third conducting section includes the organic semiconductor material.

According to the present configuration, the first through third conducting sections can be formed without doping the impurity in the semiconductor layer including the organic semiconductor material.

In the above semiconductor device, it is preferable that the first channel region and the second channel region include an organic semiconductor material, and each of the first conducting section, the second conducting section, and the third conducting section includes metal.

According to the present configuration, the first through third conducting sections can be formed without doping the impurity in the semiconductor layer including the organic semiconductor material.

In view of the above technical problems, a semiconductor device according to another aspect of the invention includes a substrate, a first gate electrode, a second gate electrode, a first channel region positioned between the substrate and the first gate electrode, a second channel region positioned between the substrate and the second gate electrode, a gate insulation film positioned at least between the first channel region and the first gate electrode, and between the second channel region and the second gate electrode, a first conducting section, a second conducting section, and a third conducting section each positioned between the substrate and the gate insulation film, and an intermediate electrode overlapping a part of the first gate electrode and a part of the second gate electrode, wherein the first channel region is positioned between the first conducting section and the second conducting section, and the second channel region is positioned between the second conducting section and the third conducting section.

According to this aspect, it becomes possible to suppress concentration of the electric field on the end portion of the drain region of the transistor included in the semiconductor device, thus the drain withstand voltage can be improved. Therefore, an abnormal leakage current can be prevented from flowing through the drain region of the transistor, and dielectric breakdown can be prevented from being caused in the drain region of the transistor.

In the above semiconductor device, it is preferable that the shortest distance between the first conducting section and the second conducting section is greater than the shortest distance between the second conducting section and the third conducting section.

According to the present configuration, the voltage applied to the second gate electrode can be smaller with respect to the voltage applied to the first gate electrode when the gate voltage is applied to the first gate electrode.

In the above semiconductor device, it is preferable that the intermediate electrode is a metal film with an island shape.

According to the present configuration, the voltage applied to the second gate electrode can be smaller with respect to the voltage applied to the first gate electrode when the gate voltage is applied to the first gate electrode.

In the above semiconductor device, it is preferable that there is further provided an interlayer insulation film positioned at least between the first gate electrode and the intermediate electrode, and between the second gate electrode and the intermediate electrode, wherein the part of the first gate electrode and the intermediate electrode form a first capacitor with the intervention of the interlayer insulation film, and the part of the second gate electrode and the intermediate electrode form a second capacitor with the intervention of the interlayer insulation film.

According to the present configuration, a first part of the first gate electrode overlaps with the first channel region via the gate insulating film to form a first capacitor. A second part of the first gate electrode overlaps with a part of the intermediate electrode via an interlayer insulation film to form a second capacitor. The voltage provided for the first electrode is divided into two parts, one for the first capacitor and the other for the second capacitor.

In the above semiconductor device, it is preferable that the part of the first gate electrode and the intermediate electrode form a first capacitor with the intervention of the gate insulation film, and the part of the second gate electrode and the intermediate electrode form a second capacitor with the intervention of the gate insulation film.

According to the present configuration, a first part of the first gate electrode overlaps with the first channel region via the gate insulating film to form a first capacitor. A second part of the first gate electrode overlaps with a part of the intermediate electrode via an interlayer insulation film to form a second capacitor. The voltage provided for the first electrode is divided into two parts, one for the first capacitor and the other for the second capacitor.

In the above semiconductor device, it is preferable that the first channel region and the second channel region include an inorganic semiconductor material, and each of the first conducting section, the second conducting section, the third conducting section, and the intermediate electrode includes an impurity and the inorganic semiconductor material.

According to the present configuration, when forming the first through third conducting sections, and the intermediate electrode, a method of doping the impurity in the semiconductor layer including the inorganic semiconductor material can be used, for example, thus the manufacturing process becomes easy.

In the above semiconductor device, it is preferable that the first channel region and the second channel region include an organic semiconductor material, and each of the first conducting section, the second conducting section, the third conducting section, and the intermediate electrode includes the organic semiconductor material.

According to the present configuration, the first through third conducting sections can be formed without doping the impurity in the semiconductor layer including the organic semiconductor material.

In the above semiconductor device, it is preferable that the first channel region and the second channel region include an organic semiconductor material, and each of the first conducting section, the second conducting section, the third conducting section, and the intermediate electrode includes metal.

According to the present configuration, the first through third conducting sections can be formed without doping the impurity in the semiconductor layer including the organic semiconductor material.

In view of the above technical problems, a semiconductor device according to another aspect of the invention includes a substrate, a first conducting section, a second conducting section, a third conducting section, and an intermediate electrode each positioned on the substrate, a semiconductor film including an organic semiconductor material, and positioned at least between the first conducting section and the second conducting section, and between the second conducting section and the third conducting section, a gate insulation film positioned, at least on the organic semiconductor film and on the intermediate electrode, a first gate electrode positioned at least on the gate insulation film, overlapping the semiconductor film and the intermediate electrode via the gate insulation film, and forming a first capacitor with the intermediate electrode, and a second gate electrode positioned at least on the gate insulation film, overlapping the semiconductor film and the intermediate electrode via the gate insulation film, and forming a second capacitor with the intermediate electrode, wherein the shortest distance between the first conducting section and the second conducting section is greater than the shortest distance between the second conducting section and the third conducting section.

According to this aspect, it becomes possible to suppress concentration of the electric field on the end portion of the drain region of the transistor included in the semiconductor device, thus the drain withstand voltage can be improved. Therefore, an abnormal leakage current can be prevented from flowing through the drain region of the transistor and dielectric breakdown can be prevented from being caused in the drain region of the transistor.

BRIEF DESCRIPTION OF THE DRAWINGS

The invention will now be described with reference to the accompanying drawings, wherein like numbers refer to like elements.

DESCRIPTION OF EXEMPLARY EMBODIMENTS

Hereinafter an embodiment of a semiconductor device according to the invention will be explained with reference to the accompanying drawings.

First Embodiment

Figure 1:
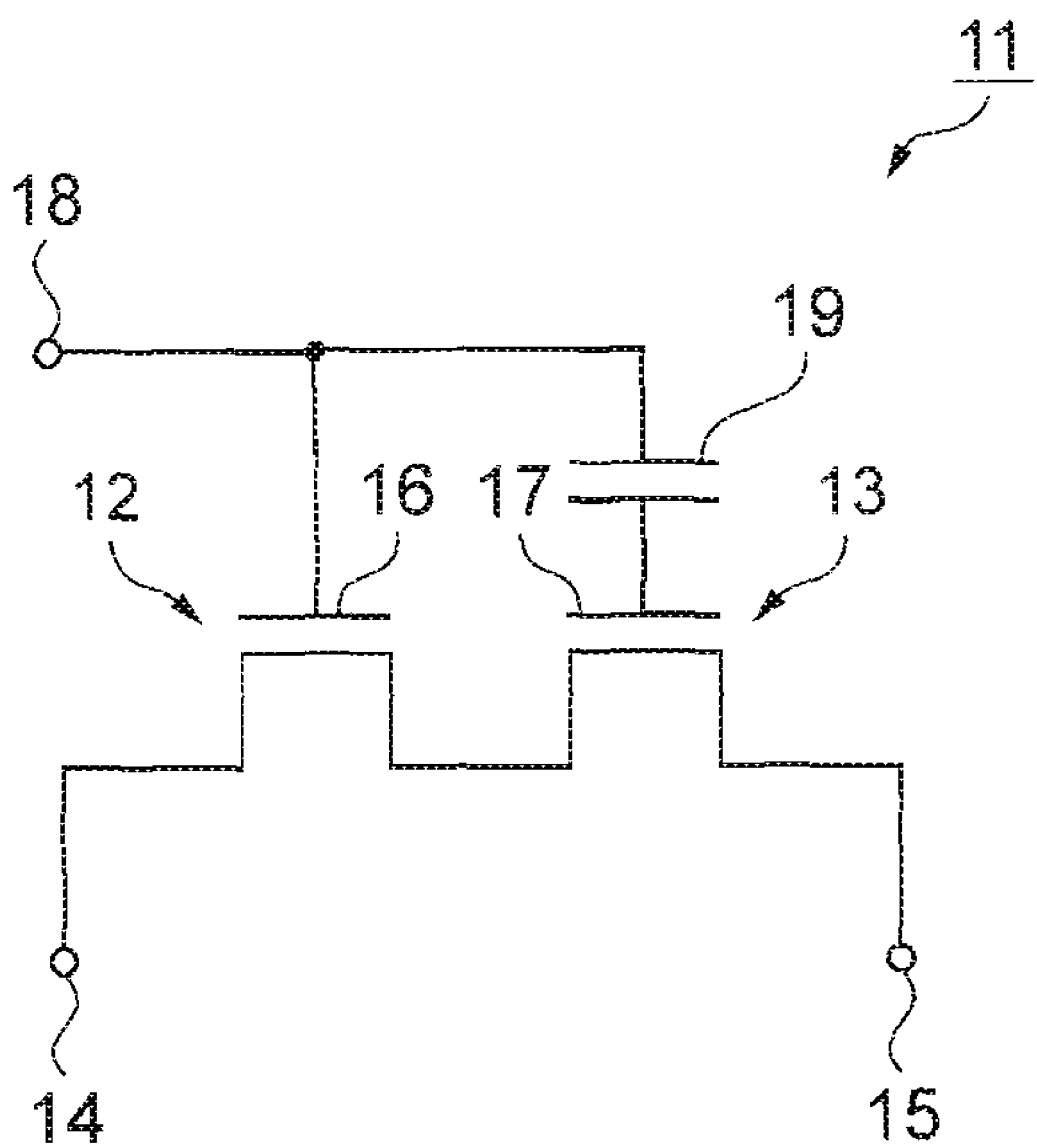
FIG. 1 is an equivalent circuit diagram schematically showing the configuration of a semiconductor element according to an embodiment.

FIG. 1 is an equivalent circuit diagram schematically showing the configuration of a semiconductor element having a multi-gate structure provided to a semiconductor device. Hereinafter, the configuration of the semiconductor element having a multi-gate structure will be explained with reference to FIG. 1.

As shown in FIG. 1, the semiconductor element 11 has a multi-gate structure, and the equivalent circuit thereof has a structure in which a first semiconductor element 12 and a second semiconductor element 13 are connected in series with each other. In detail, the structure has a first gate electrode 16 and a second gate electrode 17 formed between a source terminal 14 and a drain terminal 15.

The first gate electrode 16 electrically directly connected to the gate terminal 18. The second gate electrode 17 is connected to the gate terminal 18 via a capacitor 19 for dividing the capacitance. In other words when a voltage is applied to the gate terminal 18, the capacitor 19 and the second gate electrode 17 divide the voltage.

As described above, the semiconductor element 11 having the multi-gate structure has a structure allowing high voltage driving in comparison with a semiconductor element having a single-gate structure because the drain voltage can be divided by a number of gate electrodes connected to each other such as the first gate electrode 16 and the second gate electrode 17.

Figure 2:
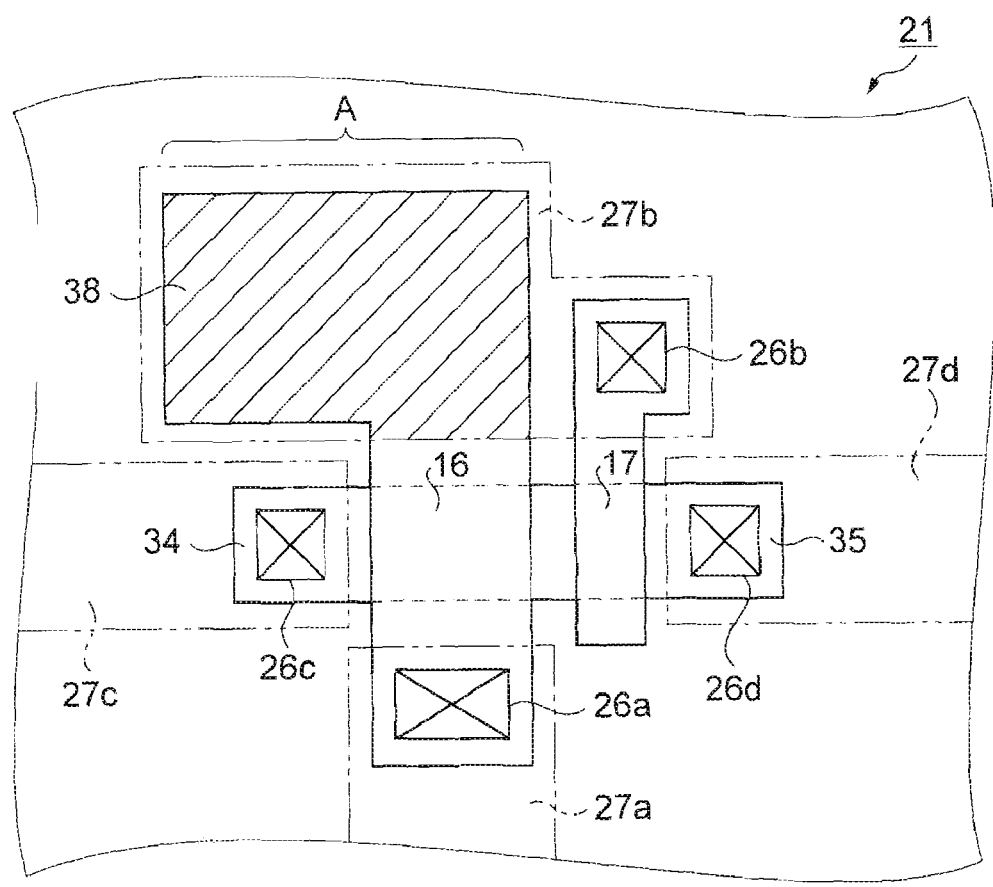
FIG. 2 is a schematic plan view showing the structure of the semiconductor device according to a first embodiment.
Figure 3:
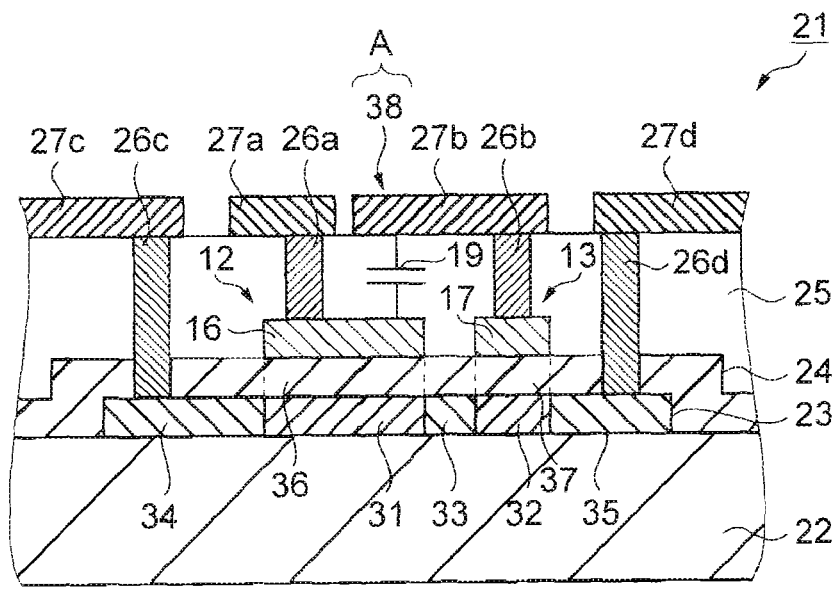
FIG. 3 is a schematic cross-sectional view showing the structure of the semiconductor device according to the first embodiment.

FIG. 2 is a schematic plan view showing the structure of the semiconductor device. FIG. 3 is a schematic cross-sectional view showing the structure of the semiconductor device shown in FIG. 2. It should be noted that the plan view shown in FIG. 2 illustrates the condition of eliminating an aluminum wiring layer 27a through 27d (illustrated by hypothetical lines) and an interlayer insulation film 25. Hereinafter, the structure of the semiconductor device will be explained with reference to FIGS. 2 and 3.

As shown in FIGS. 2 and 3, the semiconductor device 21 is provided with the multi-gate structure described above, and having a semiconductor layer 23 as a semiconductor film formed on the substrate 22 made of glass or the like, a gate insulation film 24 covering the semiconductor layer 23, and the first gate electrode 16 and the second gate electrode 17 formed on the gate insulation film 24. Further, the semiconductor device 91 is provided with the interlayer insulation film 25 covering the first gate electrode 16, the second gate electrode 17, and the gate insulation film 24, a first contact plug 26a as a first plug, a second contact plug 26b as a second contact plug, a third contact plug 26c, a fourth contact plug 26d, the first contact plug 26a through the fourth contact plug 26d being positioned inside a number of contact holes provided to the interlayer insulation film 25, and a first aluminum wiring layer 27a through a fourth aluminum wiring layer 27d respectively connected to the first contact plug 26a through the fourth contact plug 26d.

The semiconductor layer 23 is patterned to have a predetermined shape; and is composed of an inorganic semiconductor material such as polycrystal silicon (p-Si). Further, the semiconductor layer 23 is provided with a first channel region 31 and a second channel region 32 distant from each other, a high concentration impurity region (source/drain region) 33 for connecting these two channel regions 31, 32, an independent source region 34 adjacent to the first channel region 31, and an independent drain region 35 adjacent to the second channel region 32. The high concentration impurity region 33, the source region 34; and the drain region 35 have functions as conducting sections of the semiconductor device 21.

In detail, the semiconductor device 21 has a structure in which the first semiconductor element 12 and the second semiconductor element 13 are serially connected to each other via the high concentration impurity region 33 as described above. Further, the high concentration impurity region 33 includes a drain region of the first semiconductor element 12 and the source region of the second semiconductor element 13.

The gate insulation film 24 is composed of, for example a silicon oxide film, and the area thereof sandwiched between the first gate electrode 16 and the first channel region 31 forms a first gate capacitance 36, and the area thereof sandwiched between the second gate electrode 17 and the second channel region 32 forms a second gate capacitance 37.

The first gate electrode 16 is used for mainly controlling driving of the semiconductor device 21, and is made of, for example, tantalum (Ta). Further, the first gate electrode 16 is patterned in alignment with the first channel region 31 so as to cover the first channel region 31 via the gate insulation film 24. Further, the first gate electrode 16 is electrically connected via the first contact plug 26a to the first aluminum wiring layer 27a formed on the interlayer insulation film 25. It should be noted that the first aluminum wiring layer 27a is electrically directly connected to the gate terminal 18 (see FIG. 1).

The second gate electrode 17 is used for relaxing the electrical field concentration on the end portion of the drain region 35, and is made of, for example, tantalum (Ta). Further, the second gate electrode 17 is patterned in alignment with the second channel region 32 so as to cover the second channel region 32 via the gate insulation film 24. Further, the second gate electrode 17 is electrically connected via the second contact plug 26b to the second aluminum wiring layer 27b as an intermediate electrode formed on the interlayer insulation film 25.

The second aluminum wiring layer 27b is a metal film formed as an island, and one end 38 of the second aluminum wiring layer 27b is formed so as to extend to an area A overlapping, in a plan view, a part of the area of the first gate electrode 16. A part of the interlayer insulation film 25 existing in the overlapping area A forms the interlayer insulation film capacitor 19 (corresponding to "the capacitor 19" in FIG. 1, and illustrated by a circuit symbol). In other words, the interlayer insulation film capacitor 19 is composed using a part of the first gate electrode 16 and a part of the second aluminum wiring layer 27b as the electrodes, and a part of the interlayer insulation film as the dielectric layer. The second gate electrode 17 is connected to the first gate electrode 16 via the interlayer insulation film capacitor 19. Further, by serially connecting the interlayer insulation film capacitor 19 to the second electrode 17, it becomes possible to divide the capacitance into the second gate capacitance 37 and the capacitance of the interlayer insulation film capacitor 19.

Further, the second gate electrode 17 is formed to have a smaller gate length than that of the first gate electrode 16. In detail, the gate length of the second gate electrode 17 is as small as possible capable of suppressing the punch-through phenomenon, and is 2 μm for example. By adopting such a gate length, an effect of the charge-up (e.g., the drive capacity) caused by providing the interlayer insulation film capacitor 19 can be reduced. It should be noted that the gate length denotes here the minimum distance between the source region and the drain region. In other words, the gate length of the second gate electrode 17 denotes the minimum distance between the high concentration impurity region 33 and the drain region 35. The gate length of the first electrode 16 can be defined in the same manner.

The source region 34 is electrically connected to the source terminal 14 (see FIG. 1) formed on the interlayer insulation film 25 via the third contact plug 26c, the third aluminum wiring layer 27c, and so on.

The drain region 35 is electrically connected to the drain terminal 15 (see FIG. 1) formed on the interlayer insulation film 25 via the fourth contact plug 26d, the fourth aluminum wiring layer 27d, and so on.

As described above, by connecting the interlayer insulation film capacitor 19 serially to the second gate electrode 17, it becomes possible to divide the capacitance into the second gate capacitance 37 and the capacitance of the interlayer insulation film capacitor 19, thus the voltage applied to the second gate electrode 17 can be made lower in comparison with that of the first gate electrode 16. Thus, it becomes possible to distribute the electric field concentrated on the end portion of the drain region 35 when a voltage is applied to the drain region 35, thus the end portion is decreased in the electric field intensity. Further, since the interlayer insulation film 25 is used as the dielectric layer of the capacitor, it can be formed more easily in comparison with, for example, a method of taking measures of patterning a part of the gate insulation film 24 thicker to relax the concentration of the electric field.

Further, the semiconductor device 21 according to the present embodiment of the invention can be applied, for example, to a pixel circuit for forming an individual pixel in an electro-optic device such as an EL device or a liquid crystal device and a driver (an integrated circuit) for controlling the pixel circuit. Further, it can also be applied to various kinds of devices besides such electro-optic devices, As described above, according to the semiconductor device 21 of the first embodiment, the advantages described below can be obtained.

According to the semiconductor device 21 of the first embodiment, since the interlayer insulation film capacitor 19 formed with the part of the interlayer insulation film 25 existing in the area A where the second aluminum wiring layer 27b and the first gate electrode 16 overlap each other in a plan view is connected serially to the second gate electrode 17, it becomes possible to divide the capacitance into the capacitance of the interlayer insulation film capacitor 19 and the second gate capacitance 37. Thus, the voltage applied to the second gate electrode 17 can be smaller in comparison with the voltage applied to the first gate capacitance 36 when the gate voltage is applied to the first gate electrode 16 and the interlayer insulation film capacitor 19. Therefore, it becomes possible to distribute the electric field concentrated on the end portion of the drain region 35 when a voltage is applied to the drain region 35, thus the end portion of the drain region 35 is decreased in the electric field intensity. As a result, the withstand voltage oft the drain can be improved, thus preventing the abnormal leakage current from flowing through the drain region 35 and the dielectric breakdown from being caused in the drain region 35. Thus, the semiconductor device 21 having the multi-gate structure allowing high voltage driving call be provided.

According, to the semiconductor device 21 of the first embodiment, by forming the second gate electrode 17 to have the gate length as small as possible enough for suppressing the punch-through phenomenon, the effect of the charge-up caused by providing the interlayer insulation film capacitor 19 can be reduced. Therefore, there can be provided the semiconductor device 21 capable of preventing the leakage current from flowing through the drain region 35, and in addition of reducing (e.g., in comparison with the LDD structure) an amount of reduction of the output current.

It should be noted that, although not shown in the drawings, in the semiconductor device 21 of the first embodiment, it can also be arranged to electrically connect the first gate electrode 16 and the second aluminum wiring layer 27b to each other via the contact plug provided to the interlayer insulation film 25. In this case, the second gate electrode 17 and the second aluminum wiring layer 27b are insulated from each other via the interlayer insulation film 25, thus forming a capacitor.

Further, in the semiconductor device 21 according to the first embodiment, it is possible that the first gate electrode 16 and the second aluminum wiring layer 27b are insulated from each other via the interlayer insulation film 25 to form the first capacitor, and the second gate electrode 17 and the second aluminum wiring layer 27b are insulated from each other via the interlayer insulation film 25 to form the second capacitor.

Second Embodiment

Figure 4:
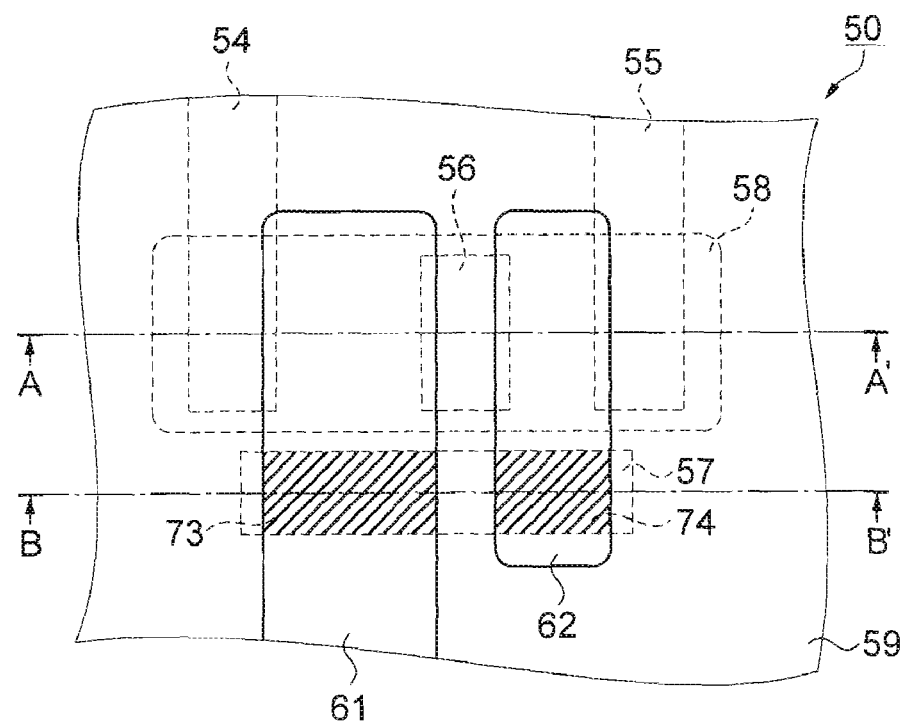
FIG. 4 is a schematic plan view showing the structure of the semiconductor device according to a second embodiment.
Figure 5A:
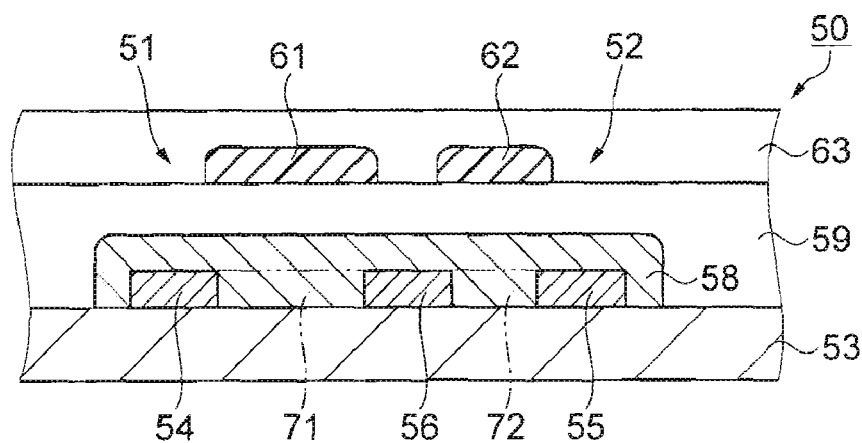
FIGS. 5A and 5B are schematic cross-sectional views showing the structure of the semiconductor device according to the second embodiment.
Figure 5B:
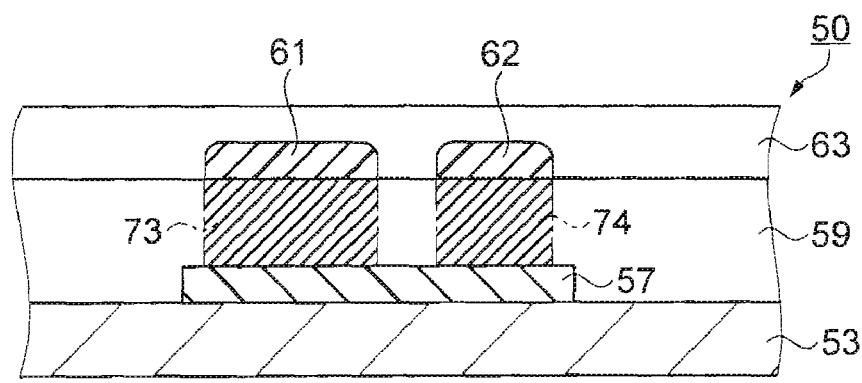

FIG. 4 is a schematic plan view showing the structure of the semiconductor device. FIG. 5A is a schematic cross-sectional view along the A-A' line in the semiconductor device shown in FIG. 4. FIG. 5B is a schematic cross-sectional view along the B-B' line in the semiconductor device shown in FIG. 4. Further, in the semiconductor device shown in FIG. 4, the passivation film is omitted from the illustration. It should be noted that the semiconductor device according to the second embodiment is different from the semiconductor device according to the first embodiment in that it is a semiconductor device (an organic TFT) using a semiconductor layer including an organic semiconductor material instead of the semiconductor device including the inorganic semiconductor material. Hereinafter, the structure of the semiconductor device according to the second embodiment will be explained with reference to FIGS. 4 and 5.

As shown in FIGS. 4 and 5, the semiconductor device 50 is provided with a multi-gate structure as in the first embodiment, and further a first semiconductor element 51 (corresponding to the first semiconductor element 12 shown in FIG. 1), and a second semiconductor element 52 (corresponding to the second semiconductor element 13 shown in FIG. 1). The semiconductor device 50 having the first semiconductor element 51 and the second semiconductor element 52 is provided with a source electrode 54 as a source region formed on a substrate 53 (a first surface) made, for example, of polyethylene terephthalate (PET), a drain electrode 55 as a drain region, a common electrode 56 as a source/drain region, an intermediate electrode 57, and a semiconductor layer 58 as a semiconductor film formed on these electrodes 54, 55 56 and 57, and on the substrate 53. Further, the semiconductor device 50 is provided with a gate insulation film 59 formed on the semiconductor layer 58, a first gate electrode 61 (corresponding to the first gate electrode 16 shown in FIG. 1) and a second gate electrode 62 (corresponding to the second gate electrode 17 shown in FIG. 13 both formed on the gate insulation film 59, and a passivation film 63 formed so as to cover the gate electrodes 61, 62 and the gate insulation film 59.

The material of the substrate 53 is not limited to the polyethylene terephthalate (PET) described above, but the substrate 53 can be a plastic substrate (a resin substrate) made, for example, of polycarbonate (PC) or polyimide (PI).

The source electrode 54 is connected to the source terminal 14 (see FIG. 1), and patterned on a part of the substrate 53. As the material of the source electrode 54, a conductive metal material is used, and Cr (chromium) and Au (gold) can be cited, for example. Further, it is possible to use a conductive organic material instead of the conductive metal material.

The drain electrode 55 is connected to the drain terminal 15 (see FIG. 1), and is patterned on a part of the substrate 53 distant from the source electrode 54. As the material of the drain electrode 55, Cr (chromium) and Au (gold) can be cited, for example, similarly to the source electrode 54.

The common electrode 56 (source/drain electrode) is patterned between the source electrode 54 and the drain electrode 55 on the substrate 53 with a predetermined distance from each of the electrodes (54, 55). The common electrode 56 includes a drain electrode of the first semiconductor element 51 and the source electrode of the second semiconductor element 52. The semiconductor layer 58 between the source electrode 54 and the common electrode 56 becomes a first channel region 71. Further, the semiconductor layer 58 between the drain electrode 55 and the common electrode 56 becomes a second channel region 72. The common electrode 56, the source electrode 54, and the drain electrode 55 have functions as conducting sections of the semiconductor device 50.

Further, the semiconductor device 50 has a structure of connecting the first semiconductor element 51 and the second semiconductor element 52 to each other via the common electrode 56. As the material of the common electrode 56, Cr (chromium) and Au (gold) can be cited, for example, similarly to the source electrode 54 and the drain electrode 55 described above.

The intermediate electrode 57 is a metal film formed to have an island shape, and is used for forming a capacitor for relaxing concentration of the electric field on an end portion of the drain electrode 55. The intermediate electrode 57 is formed adjacent to an end portion (an end portion of the semiconductor layer 58) of each of the source electrode 54, the common electrode 56, and the drain electrode 55 on the substrate 53, for example, in detail, the intermediate electrode 57 is formed so as to straddle a partial area of the first gate electrode 61 and a partial area of the second gate electrode 62 in a plan view via the gate insulation film 59. As the material of the intermediate electrode 57, Cr (chromium) and Au (gold) can be cited, for example, similarly to the source electrode 54 and the drain electrode 55 described above.

The semiconductor 58 is formed so as to cover at least a part of each of the source electrode 54, the common electrode 56, the drain electrode 55, and the substrate 53. As the material of the semiconductor layer 58, both of a low molecular weight organic semiconductor material and a polymeric organic semiconductor material can be used.

As the low molecular weight organic semiconductor material, pentacene, anthracene, and tetracene can be cited, for example. Further, as the polymeric organic semiconductor material, for example, poly(3-hexylthiophene) (P3HT) and poly(3-alkylthiophene) can be cited. Further, an evaporation method is used, for example, in the case of the low molecular weight organic semiconductor material. In the case of the polymeric organic semiconductor material, for example, a coating method is used.

The gate insulation film 59 is formed so as to cover the semiconductor 58 and at least a part of the substrate 53.

As the material of the gate insulation film 59, polyimide, methacrylate, polystyrene, and so on can be cited. It should be noted that a structure having an interlayer insulation film between the intermediate electrode 57 and the first gate electrode 61, the second gate electrode 62 instead of the gate insulation film 59 can also be adopted. Further, a structure having both of the gate insulation film 59 and the interlayer insulation film can also be adopted.

The first gate electrode 61 is used mainly for controlling driving of the semiconductor device 50, and is formed on the gate insulation film 59 so as to straddle the first channel region 71 and the common electrode 56. A part of the gate insulation film 59 sandwiched between the first gate electrode 61 and the first channel region 71 forms a first gate capacitance. Further, a part of the first gate electrode 61, a part of the intermediate electrode 57, and a part of the gate electrode 59 sandwiched therebetween form a first capacitor 73.

Further, the first gate electrode 61 is electrically directly connected to the gate terminal 18 (see FIG. 1). The first gate electrode 61 is formed, for example, by a liquid phase process using a solution containing either one of metal fine particles and organic metal compound. As such a solution, a dispersion liquid dispersing metal fine particles in a dispersion medium, a liquid organic metal compound, a solution of an organic metal compound, or a mixture thereof can be used. As the organic metal compound, a compound containing silver, for example, can be cited.

The second gate electrode 62 is used for relaxing concentration of the electric field on an end portion of the drain electrode 55, and is formed on the gate insulation film 59 so as to straddle the second channel region 72 and the intermediate electrode 57 in a plan view. A part of the gate insulation film 59 sandwiched between the second gate electrode 62 and the second channel region 72 forms a second gate capacitance. Further, a part of the second gate electrode 62, a part of the intermediate electrode 57, and a part of the gate electrode 59 sandwiched therebetween form a second capacitor 74.

It should be noted that the first capacitor 73 and the second capacitor 74 collectively correspond to the "capacitor 19" shown in FIG. 1. In other words, the first gate electrode 61 and the second gate electrode 62 are connected to each other via the intermediate electrode 57, the first capacitor 73, and the second capacitor 74. Regarding the material of the second gate electrode 62, for example, the same as in the case with the first gate electrode 61 can be applied.

Further, the second gate electrode 62 is formed to have a smaller gate length than that of the first gate electrode 61. In detail, similarly to the first embodiment, the length is set as small as possible capable of suppressing the punch-through phenomenon. The gate length of the second gate electrode 62 is, for example, 2 μm. By adopting such a gate length, an effect of the charge-up (e.g., the drive capacity) caused by providing the first capacitor 73 and the second capacitor 74 can be reduced.

Further, by connecting the first capacitor 73 and the second capacitor 74 serially to the second gate electrode 62, it becomes possible to divide the capacitance into the second gate capacitance, the first capacitance of the first capacitor 73, and the second capacitance of the second capacitor 74.

The passivation film 63 is formed so as to cover at least a part of each of the first gate electrode 61, the second gate electrode 62, and the gate insulation film 59. As the material of the passivation film 63, similarly to the gate insulation film 59 described above, there can be cited, for example, polyimide, methacrylate, polystyrene.

As described hereinbefore, by connecting two capacitors (the first capacitor 73 and the second capacitor 74) serially to the second gate electrode 62, the capacitance can be divided into the second gate capacitance, the first capacitance of the first capacitor 73, and the second capacitance of the second capacitor 74, thus the voltage applied to the second gate electrode 62 can be made smaller in comparison with the first gate electrode 61. Thus, it becomes possible to distribute the electric field concentrated on the end portion of the drain electrode 55 when a voltage is applied to the drain electrode 55, thus the end portion is decreased in the electric field intensity.

Further, in the semiconductor device 50 according to the second embodiment, the substrate 53 is formed of an elastic resin substrate, and accordingly the whole of the semiconductor device 50 is configured with flexibility. Therefore, it can be applied, for example, to an electronic paper.

As described in detail above, according to the semiconductor device 50 of the second embodiment, the following advantages can be obtained in addition to the two advantages of the first embodiment described above.

According to the semiconductor device 50 (an organic TFT) of the second embodiment, although a typical organic TFT has a problem that the LDD structure is difficult to be formed therein because control of the impurity to be implanted thereto is more difficult in comparison with a silicon TFT, it is possible to give the semiconductor device 50 an equivalent function to that of the LDD structure without implanting the impurity by adopting the structure described above. Therefore, it becomes possible to disperse the electric field concentrating on the end portion of the drain electrode 55, thus decreasing the end portion in the electric field intensity.

It should be noted that, although not shown in the drawings, in the semiconductor device 50 of the second embodiment, it can also be arranged to electrically connect the first gate electrode 61 and the intermediate electrode 57 to each other via the contact plug provided to the gate insulation film 59. In this case, the second gate electrode 62 and the intermediate electrode 57 are insulated from each other via the gate insulation film 59, thus forming a capacitor.

Further, in the semiconductor device 50 of the second embodiment, it can also be arranged to electrically connect the second gate electrode 62 and the intermediate electrode 57 to each other via the contact plug provided to the gate insulation film 59. In this case, the first gate electrode 61 and the intermediate electrode 57 are insulated from each other via the gate insulation film 59, thus forming a capacitor.

It should be noted that in the first embodiment although the advantages of the embodiment of the invention can be obtained also by using an organic semiconductor material for the semiconductor layer 23, it is preferable too use an inorganic semiconductor material to which the contact plug can easily be formed because there is used the stacked layer structure using the second aluminum wiring layer 27b, which is the upper layer of the first gate electrode 16, as the intermediate electrode. Further, in the second embodiment, although the advantages of the embodiment of the invention can be obtained also by using an inorganic semiconductor material for the semiconductor layer 58, it is preferable to use an organic semiconductor material for the semiconductor layer 58 if there is no need for forming the contact plugs.

It should be noted that the embodiment is not limited to those described above, but can be put into practice in the following forms.

Modified Embodiment 1

The multi-gate structure of the semiconductor device 21 is not limited to the configuration with the first gate electrode 16 and the second gate electrode 17 as in the first embodiment, the multi-gate structure with a plurality of gate electrodes according to needs connected thereto can also be targeted. Further, the same applies to the semiconductor device 50 according to the second embodiment.

Modified Embodiment 2

Formation of the first semiconductor element 12 and the second semiconductor element 13 on the substrate made, for example, of glass as in the first embodiment described above is not a limitation, but it is possible to form the first semiconductor element 12 and the second semiconductor element 13, for example, on a semiconductor substrate.

Modified Embodiment 3

Forming the wiring layer of the aluminum wiring layers 27a through 27d as in the first embodiment is not a limitation, but the wiring layer made of metal, for example, is sufficient.

The entire disclosure of Japanese Patent Application Nos. 2006-101658, filed Apr. 3, 2006 and 2007-043392, filed Feb. 23, 2007 are expressly incorporated by reference herein.

What is claimed is:

1. A semiconductor device, comprising:
a substrate;
a first gate electrode;
a second gate electrode;
a first channel region positioned between the substrate and the first gate electrode;
a second channel region positioned between the substrate and the second gate electrode;

a gate insulation film positioned at least between the first channel region and the first gate electrode, and between the second channel region and the second gate electrode;

a first conducting section positioned between the substrate and the gate insulation film;

a second conducting section positioned between the substrate and the gate insulation film, the first channel region being positioned between the first conducting section and the second conducting section;

a third conducting section positioned between the substrate and the gate insulation film, the second channel region being positioned between the second conducting section and the third conducting section; and an intermediate electrode electrically connected to the second gate electrode, and overlapping a part of the first gate electrode, wherein:

the first gate electrode forms a capacitor with the intermediate electrode; and the second gate electrode is electrically connected with the first gate electrode via the capacitor.

2. The semiconductor device according to claim 1, the shortest distance between the first conducting section and the second conducting section being greater than the shortest distance between the second conducting section and the third conducting section.

3. The semiconductor device according to claim 1, further comprising:

an interlayer insulation film positioned at least between the first gate electrode and the intermediate electrode, and between the second gate electrode and the intermediate electrode, the second gate electrode and the intermediate electrode being electrically connected to each other via a contact plug provided to the interlayer insulation film, and the first gate electrode and the intermediate electrode forming the capacitor with the interlayer insulation film.

4. The semiconductor device according to claim 1, the second gate electrode and the intermediate electrode being electrically connected to each other via a contact plug provided to the gate insulation film, and the first gate electrode and the intermediate electrode forming the capacitor with the gate insulation film.

5. The semiconductor device according to claim 1, each of the first channel region and the second channel region including an inorganic semiconductor material, and each of the first conducting section, the second conducting section, and the third conducting section including an impurity and the inorganic semiconductor material.

6. The semiconductor device according to claim 1, each of the first channel region and the second channel region including an organic semiconductor material, and each of the first conducting section, the second conducting section, and the third conducting section including a conductive organic material.

7. The semiconductor device according to claim 1, each of the first channel region and the second channel region including an organic semiconductor material, and each of the first conducting section, the second conducting section, and the third conducting section including a metal.

8. A semiconductor device, comprising:
a substrate;
a first gate electrode;
a second gate electrode;
a first channel region positioned between the substrate and the first gate electrode;

a second channel region positioned between the substrate and the second gate electrode;

a gate insulation film positioned at least between the first channel region and the first gate electrode, and between the second channel region and the second gate electrode;

a first conducting section positioned between the substrate and the gate insulation film;

a second conducting section positioned between the substrate and the gate insulation film, the first channel region being positioned between the first conducting section and the second conducting section;

a third conducting section positioned between the substrate and the gate insulation film, the second channel region being positioned between the second conducting section and the third conducting section; and an intermediate electrode overlapping a part of the first gate electrode and a part of the second gate electrode, wherein:

the first gate electrode forms a first capacitor with the intermediate electrode;

the second gate electrode forms a second capacitor with the intermediate electrode; and the second gate electrode is electrically connected with the first gate electrode via both the first capacitor and the second capacitor.

9. The semiconductor device according to claim 8, the shortest distance between the first conducting section and the second conducting section being greater than the shortest distance between the second conducting section and the third conducting section.

10. The semiconductor device according to claim 8, further comprising:

an interlayer insulation film positioned at least between the first gate electrode and the intermediate electrode, and between the second gate electrode and the intermediate electrode, a part of the first gate electrode and the intermediate electrode forming the first capacitor with the interlayer insulation film, and a part of the second gate electrode and the intermediate electrode forming the second capacitor with the interlayer insulation film.

11. The semiconductor device according to claim 8, a part of the first gate electrode and the intermediate electrode forming the first capacitor with the gate insulation film, and a part of the second gate electrode and the intermediate electrode forming the second capacitor with the gate insulation film.

12. The semiconductor device according to claim 8, each of the first channel region and the second channel region including an inorganic semiconductor material, and each of the first conducting section, the second conducting section, the third conducting section, and the intermediate electrode including an impurity and the inorganic semiconductor material.

13. The semiconductor device according to claim 8, each of the first channel region and the second channel region including an organic semiconductor material, and each of the first conducting section, the second conducting section, the third conducting section, and the intermediate electrode including a conductive organic material.

14. The semiconductor device according to claim 8, each of the first channel region and the second channel region including an organic semiconductor material, and each of the first conducting section, the second conducting section, the third conducting section, and the intermediate electrode including a metal.

\* \* \* \* \*